United States Patent
Ajioka et al.

(10) Patent No.: US 6,914,787 B2
(45) Date of Patent: *Jul. 5, 2005

(54) ELECTRONIC COMPONENT MODULE

(75) Inventors: Eriko Ajioka, Tokyo (JP); Shigeru Asami, Tokyo (JP); Hideaki Shimoda, Tokyo (JP); Hiroshi Ikeda, Tokyo (JP); Yoshinari Yamashita, Tokyo (JP); Hitoyoshi Kurata, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/847,308

(22) Filed: May 18, 2004

(65) Prior Publication Data

US 2004/0233644 A1 Nov. 25, 2004

(30) Foreign Application Priority Data

May 19, 2003 (JP) ........................................ 2003-139815

(51) Int. Cl.⁷ ................................................ H05K 9/00
(52) U.S. Cl. ...................................... 361/816; 361/818
(58) Field of Search ................................ 361/752, 753, 361/799, 800, 816, 818, 212, 220; 343/778, 789, 700 MS, 246, 247; 257/728; 174/35 R, 52.5

(56) References Cited

U.S. PATENT DOCUMENTS 5,633,786 A * 5/1997 Matuszewski et al. ...... 361/818
5,828,339 A    10/1998 Patel
6,320,543 B1   11/2001 Ohata et al.

FOREIGN PATENT DOCUMENTS

| JP | 6-326488  | 11/1994 |
| JP | 9-237867  | 9/1997  |
| JP | 11-340371 | 12/1999 |

OTHER PUBLICATIONS

U.S. Appl. No. 10/847,383, filed May 18, 2004, Ajioka et al.

U.S. Appl. No. 10/847,308, filed May 18, 2004, Ajioka et al.

* cited by examiner

*Primary Examiner*—Phuong T. Vu
(74) *Attorney, Agent, or Firm*—Oblon, Spivak, McClelland, Maier & Neustadt, P.C.

(57) ABSTRACT

An electronic component module includes a mounting substrate including a shield layer and on which a first cavity and a second cavity are formed. A first electronic component positioned in the first cavity is used in a first frequency band. A second electronic component positioned in the second cavity is used in a second frequency band. Lid members seal the first cavity and the second cavity. Patch antennas transmit/receive radio waves in the first and second frequency bands, the antennas being formed on a surface opposite to the electronic components mounting surface. And, connection terminals formed on the mounting substrate are electrically connected to the electronic components through transmission lines.

4 Claims, 1 Drawing Sheet

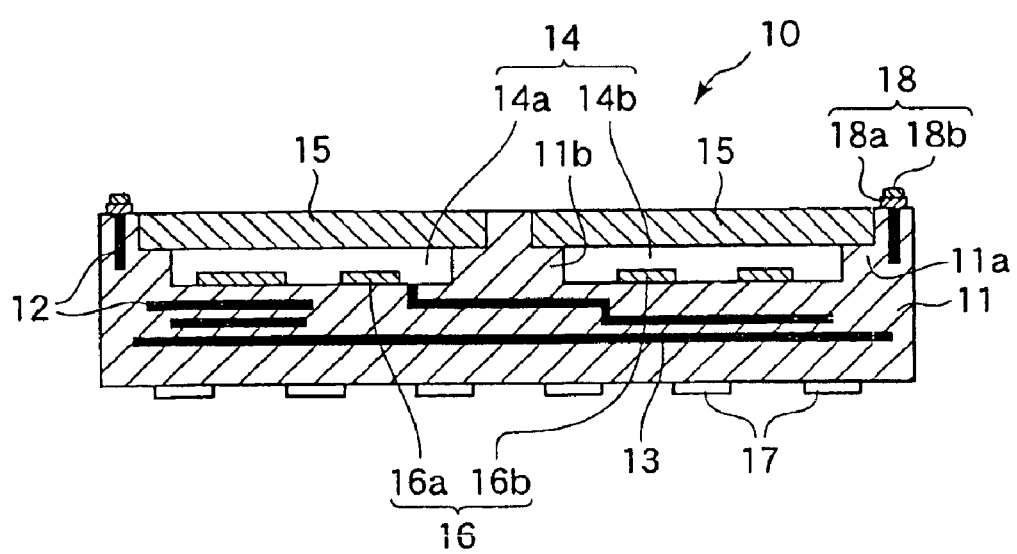

ELECTRONIC COMPONENT MODULE

BACKGROUND OF THE INVENTION

The present invention relates to an electronic component module and in particular to an electronic component module on which electronic components operating in a plurality of frequency bands are mounted.

Recently, there is a growing need for a more compact and higher-performance communications system used in the microwave band or millimeter band with easy broadband applicability and higher resolution. As a solution to satisfy such a need and reduce transmission loss between the electronic components of a communications system, there is known a technology which packs high-frequency devices or electronic components such as an amplifier, a mixer, an oscillator and a multiplier into an electronic component module in the form of a package, as mentioned in the Japanese Patent Laid-Open No. 237867/1997.

The Japanese Patent Laid-Open No. 326488/1984 discloses a technology to shield an input/output terminal while keeping out of the way of cable routing in order to avoid the influence of malfunctions caused by an electromagnetic wave in such an electronic component module.

However, the technologies described in these official gazettes require dedicated substrates and cases. Fabricating an electronic component module by using such a substrate and a case requires a complicated manufacturing process and time, thus resulting in higher costs.

Another approach of advancing the feature of the electronic component module which installs electronic components operating in frequency bands different from each other in a single package presents a problem of interference between electronic components operating in frequency bands different from each other according to the aforementioned technology.

SUMMARY OF THE INVENTION

The present invention aims at providing an electronic component module which installs electronic components operating in frequency bands different from each other in a single package while preventing interference.

In order to solve the problems, an electronic component module according to the invention comprises: a mounting substrate including a shield layer and transmission lines and on which are formed at least a first cavity and at least a second cavity as partitions; at least a first electronic component positioned in the first cavity and used in a first frequency band; at least a second electronic component positioned in the second cavity and used in a second frequency band; lid members equipped with a shielding feature which seal the first cavity and the second cavity; one or more antennas formed on a surface of the mounting substrate, the surface opposite that on which the first electronic component and the second electronic component are mounted, the one or more antennas transmitting/receiving radio waves in at least any one of the first frequency band and the second frequency band and being connected to the corresponding electronic components; and a plurality of terminals formed on the mounting substrate, the terminals connected to the first electronic component and the second electronic component via the transmission lines.

According to the invention, the first and the second electronic components are installed in electromagnetically shielded cavities different from each other to form a module. As a result, the electronic components are shielded per frequency band thus improving the isolation characteristic. It is thus possible to provide an electronic component module which installs electronic components operating in frequency bands different from each other in a single package while preventing interference.

The electronic component module according to a preferred embodiment of the invention is characterized in that the lid members are made of a metal or a nonmetal on which a metallic shield layer is formed.

This makes it possible to provide an electronic component module which installs electronic components operating in frequency bands different from each other in a single package while preventing interference.

The electronic component module according to a preferred embodiment of the invention is characterized in that the substrate component is made of ceramic.

This makes it possible to provide an electronic component module which installs electronic components operating in frequency bands different from each other in a single package while preventing interference.

The electronic component module according to a preferred embodiment of the invention is characterized in that the cavity has a shape which suppresses the unwanted resonance mode in the cavity and the unwanted propagation mode in the cavity in the operating frequency band of the electronic component in the cavity.

This obtains a good performance characteristic.

BRIEF DESCRIPTION OF THE DRAWING

FIG. 1 is a sectional view of an electronic component module according to an embodiment of the invention.

DETAILED DESCRIPTION OF THE PREFERRED EMBODIMENTS

Embodiments of the invention are described below in detail referring to attached drawings. In the attached drawings, same members are assigned a same sign and duplicated description is omitted. The embodiments are particularly useful embodiments of the invention and the invention is by no means limited to the embodiments.

FIG. 1 is a sectional view of an electronic component module according to an embodiment of the invention.

As shown in FIG. 1, the electronic component module 10 according to this embodiment is equipped with a mounting substrate 11 composed of a ceramic or the like. On the mounting substrate 11 are laminated transmission lines 12 and a shield layer 13 used in common with a ground layer. The transmission lines and the shield layer 13 are made of for example Au, Ag, Cu or W. The shield layer 13 may be separate from the ground layer.

On the mounting substrate 11 are formed an outer wall 11a and a partition wall 11b which partitions the area into a plurality of sub-areas. This forms multiple cavities 14 as partitions on the mounting substrate 11.

On the mounting substrate 11 are arranged lid members 15 which seal the cavities 14. The lid members 15 are equipped with a shielding feature, for example by way of metal-plated resin. Both sides of the cavities 14 in the direction of height as well as the shield layer 13 are electromagnetically shielded. Note that the lid members 15 may be made of metal to provide a shielding feature.

A shield layer such as metal plating may be formed on the outer wall 11a and the partition wall 11b in order to electromagnetically shield the cavities 14 in all directions.

Or, by forming a through hole or a via hole in the outer wall 11a or the partition wall 11b and using the through hole or via hole to electrically connect the lid members 15 and the shield layer 13, the cavities 14 may be electromagnetically shielded in all directions.

In the cavities 14, electronic components 16 as a plurality of high-frequency devices are coupled to the mounting substrate 11 by way of surface mounting with solder or brazing material, or flip-chip mounting with Au or Au—Sn alloy.

These electronic components 16 include a plurality of first electronic components 16a used in the submillimeter band, for example 25 GHz (first frequency band) and a plurality of second electronic components 16b used in the microwave band, for example, 5 GHz (second frequency band). The first electronic components 16a and the second electronic components 16b are installed in the separate cavities 14. To be more precise, the first electronic components 16a are installed in the first cavity 14a while the second electronic components 16b are installed in the second cavity 14b.

As mentioned earlier, both cavities 14a, 14b are electromagnetically shielded. The first electronic components 16a and the second electronic components 16b are installed in the first cavity 14a and the second cavity 14b respectively, so that the electronic components 16a, 16b are shielded per frequency to prevent interference. This improves the isolation characteristic thereby obtaining a stable performance characteristic.

The first cavity 14a or the second cavity 14b may be single or plural. The cavity 14 has a shape of a rectangle when illustrated, but may have various shapes, such as a circle and an ellipse.

The shape of the cavity 14 is preferably formed so that an unwanted propagation mode or an unwanted resonance mode will not take place in the operating frequency band of the electronic component 16 in the cavity 14.

For example, in case the electronic component 16 is a power amplifier, an unwanted propagation mode in the cavity 14 in the operating frequency band of the electronic component 16 forms a transmission line other than the transmission lines 12 in the space. This could degrade the performance of the electronic component module 10, that is, the backward passing characteristic or isolation characteristic of the electronic component 16. In order to solve such a problem, the cavity 14 is preferably formed so that the frequency band in which the cavity 14 can operate as a waveguide when the propagation mode appears in the cavity 14 will be higher than the operating frequency band of the electronic component 16.

An unwanted resonance mode in the cavity 14 in the operating frequency band of the electronic component 16 could degrade the performance of the electronic component module 10, for example, degrade the transmission characteristic of the transmission lines 12. The cavity is preferably formed so that the operating frequency band of the electronic component 16 and the frequency at which an unwanted resonance mode takes place will be different from each other.

The "unwanted propagation mode" refers to the form of electromagnetic field distribution in which the cavity 14 is operable as a waveguide in the operating frequency range of the electronic component 16. The "unwanted resonance mode" refers to the form of electromagnetic field distribution in which the cavity 14 is operable as a waveguide resonator in the operating frequency range of the electronic component 16.

The aforementioned frequencies are exemplary. The invention is not limited to these frequencies as long as the operating frequency bands of the mounted electronic components 16 differ from each other.

While the electronic components 16 operating in two frequency bands are mounted in this embodiment, it is possible to mount electronic components operating in three or more frequency bands. In this case, the electronic components operating in the frequency bands are installed in cavities different from each other.

The first electronic component 16a or the second electronic component 16b as a high-frequency device includes, but is not limited to, a power amplifier, a mixer, a multiplier, a frequency converter, a high-frequency oscillator, and a low-noise power amplifier.

Patch antennas (antennas) 17 comprising a predetermined conductor pattern are formed on the surface of the mounting substrate 11 opposite that on which the electronic components 16 are mounted. The plurality of patch antennas 17 are formed in an array so as to obtain good directivity. The patch antennas 17 include those transmitting/receiving a radio wave of 25 GHz and connected to the first electronic component 16a via the transmission lines 12, and those transmitting/receiving a radio wave of 5 GHz and connected to the second electronic component 16b via the transmission lines 12.

Instead of supporting multiple frequencies, the patch antennas 17 may be provided to support only one frequency and antennas supporting the other frequency may be provided separately from the electronic component module 10. Instead of an array of antennas, a single multi-band antenna capable of transmitting/receiving radio waves having a plurality of frequencies may be used. An antenna used is not limited to the patch antenna 17 according to this embodiment. Other forms of antennas including a reverse-F antenna and a slot antenna may be used.

On the mounting substrate 11, BGA (Ball Grid Array) terminals 18 each comprising a predetermined conductor pattern 18a and a solder ball 18b formed thereon, that is, a plurality of terminals are formed on the surface opposite that on which the patch antennas 17 are formed. The BGA terminals 18 are connected to the first electronic component 16a and the second electronic component 16b via the transmission lines 12. The electronic component module 10 is connected to peripherals via the BGA terminals 18. The terminals need not be BGA terminals 18 but various terminals having other shapes may be used.

As mentioned hereinabove, according to the electronic component module 10 of the embodiment, the first electronic components 16a are installed in the first electromagnetically shielded cavity 14a. The second electronic components 16b whose operating frequency differs from that of the first electronic components 16a are separately installed in the second electromagnetically shielded cavity 14b. The electronic components are thus provided in modules so that the first and second electronic components 16a, 16b are shielded per frequency, thereby improving the isolation characteristic and obtaining a stable performance characteristic.

This provides an electronic component module which installs electronic components operating in frequency bands different from each other in a single package while preventing interference.

The cavity 14 is formed so as to suppress the unwanted resonance mode and the unwanted propagation mode in the operating frequency band of the electronic component 16 in the cavity 14. This obtains a good performance characteristic.

As understood from the foregoing description, the invention provides the following advantages.

First electronic and second electronic components are installed in electromagnetically shielded cavities separate from each other. The electronic components are thus provided in modules so that the electronic components are shielded per frequency, thereby improving the isolation characteristic and obtaining a stable performance characteristic.

This provides an electronic component module which installs electronic components operating in frequency bands different from each other in a single package while preventing interference.

The cavity is formed so as to suppress the unwanted resonance mode and the unwanted propagation mode in the operating frequency band of the electronic component in the cavity. This obtains a good performance characteristic.

What is claimed is:

1. An electronic component module comprising:
   a mounting substrate including a shield layer and transmission lines and on which at least a first cavity and at least a second cavity are formed as partitions;
   at least a first electronic component positioned in said first cavity and used in a first frequency band;
   at least a second electronic component positioned in said second cavity and used in a second frequency band;
   lid members equipped with a shielding feature which seal said first cavity and said second cavity;
   one or more antennas formed on a surface of said mounting substrate, said surface opposite that on which said first electronic component and said second electronic component are mounted, said one or more antennas transmitting/receiving radio waves in at least any one of said first frequency band and said second frequency band and being connected to said corresponding electronic components; and
   a plurality of terminals formed on said mounting substrate, said terminals connected to said first electronic component and said second electronic component via said transmission lines.

2. The electronic component module according to claim 1, wherein said lid members are made of a metal or a nonmetal on which a metallic shield layer is formed.

3. The electronic component module according to claim 1, wherein said substrate component is made of ceramic.

4. The electronic component module according to claim 2, wherein said substrate component is made of ceramic.

* * * * *